United States Patent
Riechert et al.

[11] Patent Number: 6,028,328
[45] Date of Patent: Feb. 22, 2000

[54] HEMT DOUBLE HETERO STRUCTURE

[75] Inventors: Henning Riechert, Riemerling; Thomas Grave, München, both of Germany

[73] Assignee: Siemens Aktiengesellschaft, Munich, Germany

[21] Appl. No.: 09/091,494

[22] PCT Filed: Dec. 18, 1996

[86] PCT No.: PCT/DE96/02450

§ 371 Date: Jun. 18, 1998

§ 102(e) Date: Jun. 18, 1998

[87] PCT Pub. No.: WO97/25746

PCT Pub. Date: Jul. 17, 1997

[30] Foreign Application Priority Data

Jan. 3, 1996 [DE] Germany .................... 196 00 116

[51] Int. Cl.[7] ................ H01L 31/0328; H01L 31/0336; H01L 31/072; H01L 31/109
[52] U.S. Cl. ........................................... 257/194; 257/192
[58] Field of Search ..................... 257/192, 194

[56] References Cited

U.S. PATENT DOCUMENTS

| | | |
|---|---|---|
| 5,449,928 | 9/1995 | Matsugatani et al. . |
| 5,453,631 | 9/1995 | Onda et al. . |
| 5,751,029 | 5/1998 | Matsushita et al. ............ 257/194 |
| 5,844,260 | 12/1998 | Ohori ............................ 257/190 |
| 5,945,693 | 8/1999 | Shzhki et al. ................. 257/192 |

OTHER PUBLICATIONS

IEEE Electron Device Letters, vol. 15, No. 11, Nov. 1994, M. Wojtowicz et al, 0.10 μm graded InGaAs Channel InP HEMT with 305 GHz $f_T$ and 340 GHz $f_{max}$, 477–479.

Proceedings of the International Conference on Indium Phosphide and Related Materials, Santa Barbara, Mar. 1994, Conf. No. 6, K. B. Chough et al, High–Performance InP–based HEMT's with a Graded Pseudomorphic Channel, pp. 427–430.

Applied Physics Letters, vol. 61, No. 16, Oct. 1992, Tae–Kyung Yoo et al, Double modulation–doped AlGaAs/InGaAs heterostructure with a graded composition in the quantum well, pp. 1942–1944.

*Primary Examiner*—Ngân V. Ngô
*Attorney, Agent, or Firm*—Hill & Simpson

[57] ABSTRACT

DH-PHEMT on a GaAs substrate, with a mixed crystal composition that is varied in the channel in such a way that the lower boundary of the conduction band is lowered toward the gate contact, and advantages of an SH-PHEMT are thereby simultaneously realized. For this purpose, the channel is for example InGaAs, and the In portion x of the $In_xGa_{1-x}As$ of the channel is increased in a step from 0.2 to 0.3 in the direction toward the gate contact.

12 Claims, 4 Drawing Sheets

HEMT DOUBLE HETERO STRUCTURE

BACKGROUND OF THE INVENTION

Pseudomorphic HEMTs (high electron mobility transistors)—abbreviated PHEMT in the following—grown on a GaAs substrate are field effect transistors with a braced channel layer, in which the doping atoms that provide the charge carriers required for the charge transport from the source to the drain are wholly or partially spatially separated from the channel in which the charge transport takes place. The construction of the semiconductor layer structure required therefor is grown epitaxially. The channel, which standardly consists for example of $In_yGa_{1-y}As$, thereby has the following characteristics:

1. The lattice constant of the semiconductor crystal in the channel is (dependent on the In content y) different from the lattice constants of the surrounding semiconductor materials and of the substrate (thus the designation "pseudomorphic"). Thus, the thickness of the channel is limited if displacements, which can occur due to the insufficient adaptation of the lattice constants and which have an adverse effect on the charge carrier transport characteristics, are to be avoided.

2. The transport characteristics of the charge carriers are better in the channel than in the adjacent semiconductor layers, which likewise depends on the In portion y.

3. The energy band gap is smaller in the channel than in the adjacent layers. For this reason, the charge carriers are transferred from the doped layers adjacent to the channel into the channel, and are effectively enclosed there, i.e. in the region with the best transport characteristics. However, the energy band gap of the channel cannot be reduced arbitrarily, because very small band gaps can be achieved only with In portions y that cause sharp deviations of the lattice constants from that of the substrate or, respectively, of the remaining semiconductor layers, and, consequently, enable only very small thicknesses of the channel.

In the design of epitaxial layers for PHEMTs, a compromise must thus be found. Contents y of In that were selected with respect to a minimum band gap allow only channel thicknesses small enough that the number of charge carriers enclosed in the channel is very small, and their transport characteristics are strongly adversely influenced by the channel boundary surfaces lying close to one another. Channels that have been optimized on one side to a large thickness have band gaps that differ only slightly from those of the adjacent layers, so that the charge carriers are no longer transferred effectively from the doped layers into this channel, and are enclosed there only defectively. Moreover, in these channels the transport characteristics are only slightly superior to those of the adjacent layers.

PHEMTs on the basis of GaAs have been used up to now in two basic forms, known as single heterojunction PHEMT (SH-PHEMT) and double heterojunction PHEMT (DH-PHEMT). Both basic forms have a channel in common, which, given In portions y of 0.2 to 0.25, is typically 10 nm to 12 nm thick.

In the SH-PHEMT, the $In_yGa_{1-y}As$ channel is bounded below by a GaAs layer, and above by a semiconductor material that comprises a greater difference of the energy band gap to InGaAs than GaAs, standardly by means of $Al_xGa_{1-x}As$, more rarely by means of $In_zGa_{1-z}P$. In the SH-PHEMT, doping atoms are located only in the layer above the channel, i.e. between the channel and the surface of the component or, respectively, between the channel and the gate contact, but not in the GaAs under the channel. This means that the lower boundary of the conduction band runs in the direction perpendicular to the boundary surface between the semiconductor material and the gate contact, as shown in FIGS. 2 and 3. Given gate voltages close to the cutoff voltage of the transistor, the conduction band edge runs in the channel almost parallel to the Fermi energy, by which means the location probability of the charge carriers is greatest approximately in the center of the channel (see FIG. 2). Given more positive gate voltages, in the upper part of the channel (i.e., further left in the Figure) the conduction band lies significantly further below the Fermi energy than in the lower part of the channel, which displaces the location probability of the charge carriers upward, toward the gate contact (see FIG. 3). The average distance of the charge carriers to the gate contact is thus reduced, and their controllability by the gate contact, known as the steepness, improves in inverse proportion to this distance. However, more strongly positive gate voltages then also bring the conduction band edge of the doped material between the gate contact and the channel below the Fermi energy, so that here as well there arises an occupation with charge carriers that have poor transport characteristics and that cause the steepness to go down again.

In the DH-PHEMT, the InGaAs channel is bounded on both sides by a doped AlGaAs layer, so that the jump of the energy band edge is of equal height at the upper side and the lower side of the channel (and, as in the SH-PHEMT, is at the upper side only). The resulting path of the conduction band edge, perpendicular to the surface of the semiconductor material, is shown in FIGS. 4 and 5. Given gate voltages close to the cutoff voltage of the transistor, the upper part of the channel (i.e. in the direction toward the gate contact) lies far enough above the Fermi energy that the location probability of the charge carriers is greatest in the lower part of the channel (see FIG. 4). Here they are located close to the boundary surface of the channel with the lower AlGaAs layer, so that boundary surface scatter has a negative influence on the transport characteristics. Given a more positive gate voltage, the conduction band is located relative to the Fermi energy in such a way that now the location probability of the charge carriers is greatest in the center of the channel (see FIG. 5). The distance of the charge carrier to the gate contact has thus here as well become smaller, and the steepness increases, but not as strongly as in the SH-PHEMT (because the distance remains absolutely greater). Still more positive gate voltages bring the conduction band edge of the doped material between the gate contact and the channel into the vicinity of the Fermi energy, so that the steepness decreases again. However, in the DH-PHEMT this effect occurs later than in the SH-PHEMT, so that the range of the gate voltage within which no undesired conduction occurs in the semiconductor material between the gate contact and the channel is larger as a whole.

Given small currents (i.e., small gate-source capacitances), such as must be set in order to achieve a good signal-noise ratio, in the SH-PHEMT the majority of the charge carriers are at a distance from the boundary surfaces of the channel, so that minimal boundary surface scatter occurs, and the signal-noise ratio is superior to that of the DH-PHEMT. The maximum steepness is likewise better than in the DH-PHEMT. The SH-PHEMT is thus on the one hand particularly well suited for low-noise receiving amplifiers, but on the other hand is also well suited for all other small-signal amplifiers up into the highest frequency range (approx. 100 GHz), where the highest steepnesses are required in order to be able to achieve gain at all.

Due to the high discontinuities of the energy band edges at the upper and lower boundaries of the channel, the DH-PHEMT has a larger effective channel cross-section, and, in contrast to the SH-PHEMT, doping atoms can also be used in the semiconductor material under the channel, i.e. on the side of the channel facing away from the gate contact, so that the number of charge carriers flowing in the channel can be greater by about 20% than in the SH-PHEMT. Moreover, the greater discontinuity of the conduction band at the lower boundary of the channel means that the charge carriers require higher energies than in the SH-PHEMT in order to overcome these barriers. Thus, higher drain voltages can be applied to the component, without its being the case that the charge carriers leave the channel and penetrate into deeper layers of the semiconductor crystal, where they can no longer be controlled by the gate voltage. The high number of charge carriers in the channel, in connection with the possible high drain voltages, make DH-PHEMTs particularly suitable for power transistor applications. However, the maximum achievable steepness in the DH-PHEMT is smaller than in the SH-PHEMT, and the noise characteristics are somewhat worse. However, the higher usable range of the gate voltage in comparison to the SH-PHEMT makes the DH-PHEMT suitable for amplifiers in which the noise behavior is not so important, and linearity with the greatest possible dynamic of the input signal is more important.

In the article by M. Wojtowicz et al. in IEEE Electron Device Left. 15, 477–479 (1994), an HEMT on an InP substrate in the material system InGaAs/InAlAs is specified in which the In content in the channel varies continuously. A doping of semiconductor material for the conductivity type provided for the channel is provided only between the gate contact and the channel. As in other SH-PHEMTs, here as well in each operating state the lower edge of the conduction band runs so as to decline in the direction toward the gate contact (cf. FIGS. 2 and 3). In this graduated composition of the semiconductor material in the channel, the average location probability of the electrons is displaced more strongly in the direction toward the gate contact. By this means, the characteristics typical for SH-PHEMTs are amplified. The advantage of the path of the conduction band edge in the graduated composition of the channel is based only on the fact that due to the partially decreased In content (and the thereby reduced bracing), an overall thicker channel is enabled for the transport of charge carriers, which reduces the scatter of the electrons at the boundary surfaces in relation to conventional structures.

In the article by Tae-Kyung Yoo et al. in Appl. Phys. Left 61, 1942–1944 (1992), an HEMT is specified in which the In content of the InGaAs composition of the channel is greatest in the center of the channel. The layer structure is grown on a GaAs substrate. The non-homogenous composition of the channel is supposed to effect only a one-sided optimization of the transistor characteristics with respect to low noise, since the scatter of the charge carriers is reduced at the upper and lower boundary surfaces.

SUMMARY OF THE INVENTION

The object of the present invention is to indicate an HEMT that represents an improvement both over the SH-PHEMT and also over the DH-PHEMT.

In general terms the present invention is a HEMT with a source region, a channel region, a drain region, a respective contact in electrically conductive connection with this source region or, respectively, this drain region, and a gate contact. For the construction of a pseudomorphic double heterostructure, an upper boundary layer is arranged between this channel region and this gate contact, and a lower boundary region is arranged on the side of this channel region facing away from this gate contact. This channel region and these boundary layers are different semiconductor materials, so that the minimum of the lower boundary of the conduction band in each of these boundary layers is greater than the maximum of the lower boundary of the conduction band in the channel region. These boundary layers are doped n-conductive. The channel region has a mixed crystal composition that varies, continuously or in at least one step, in the direction from this lower boundary layer to this upper boundary layer, such that in the channel region at each distance from the lower boundary layer the lower boundary of the conduction band is not higher than would be the case if the mixed crystal composition in the region of this relevant distance from the lower boundary layer up to an arbitrary smaller distance from the lower boundary layer in the channel region were homogenous and equal to the mixed crystal composition in this smaller distance from the lower boundary layer.

In at least one distance from the lower boundary layer, the lower boundary of the conduction band is lower than would be the case if the mixed crystal composition in the region from this relevant distance from the lower boundary layer up to the boundary (facing the lower boundary layer) of the channel region were equal to the mixed crystal composition of the channel region at this boundary.

Advantageous developments of the present invention are as follows.

There is a certain distance from the lower boundary layer below which the channel region has a homogenous mixed crystal composition. There is a certain distance from the lower boundary layer above which the channel region has another homogenous mixed crystal composition.

The channel region also has a homogenous mixed crystal composition between these certain distances, which composition is different from the mixed crystal compositions between, respectively, a boundary of the channel region and the nearest thereto of these certain distances.

In one embodiment these certain distances are equal.

The channel region is $In_xGa_{1-x}As$, and the variation of the mixed crystal composition is brought about by varied In and Ga portions.

The boundary layers are AlGaAs.

The boundary layers are InGaP.

The boundary layers are AlInGaP.

The atomic portions of In at the mixed crystal compositions of the channel region vary by at least 30% with respect to the lowest value.

In the inventive HEMT, the mixed crystal composition of the semiconductor material in the channel is varied in such a way that at the boundary of the channel facing the gate contact the lower boundary of the conduction band (conduction band edge) lies lower than would be the case if the mixed crystal composition was homogenously the same as at the boundary of the channel facing away from the gate contact. A graduation of the mixed crystal composition can be present in the channel, which for example amounts to the entire thickness of the channel or which is present only in a portion of the thickness of the channel region, and is continued subsequent thereto by a homogenous composition. Instead of a (continuous) graduation of the composition, a stepped modification of the composition can be present in the channel. It is sufficient if a lower portion of the channel comprises a homogenous mixed crystal composition, and the remaining upper (i.e., placed closer to the gate contact) portion comprises a mixed crystal composition differing therefrom, which displaces the lower boundary of the conduction band downwards in this region. The channel is bounded by doped layers on both sides.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENTS

Figure 1:
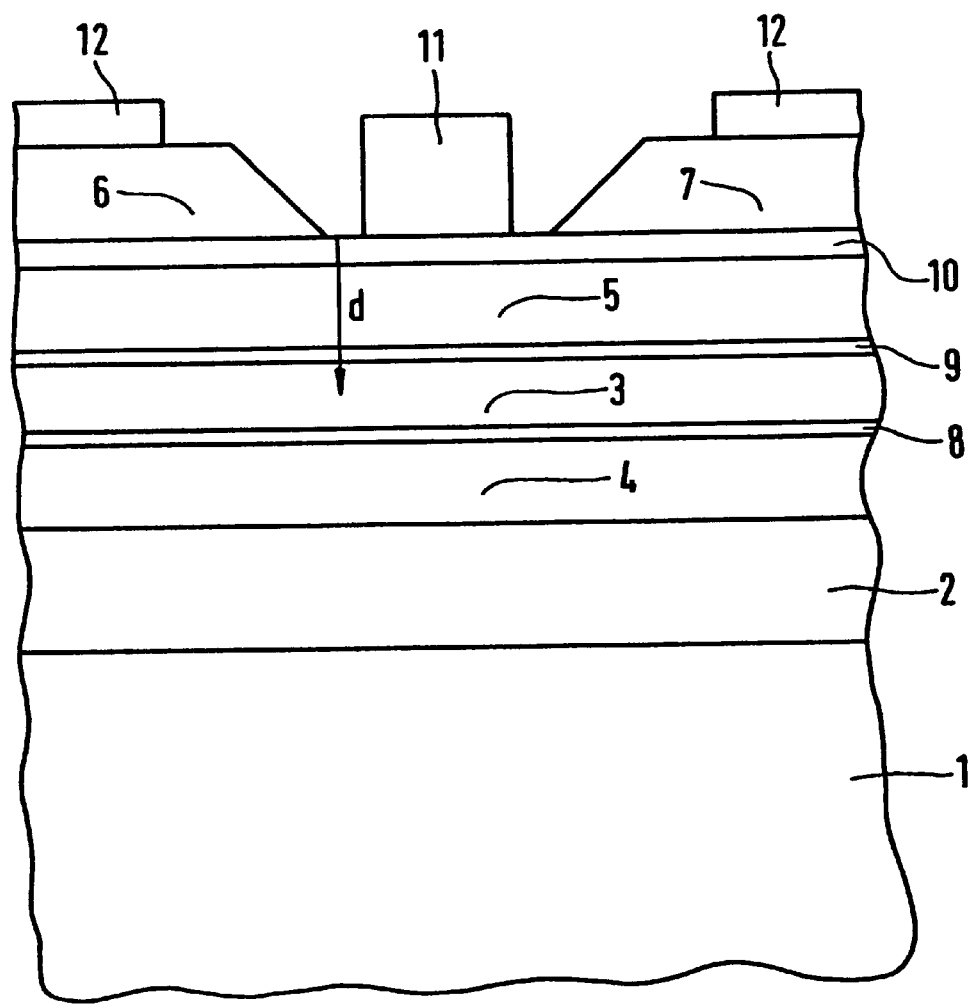
FIG. 1 shows the design of an HEMT in cross-section.
Figure 2:
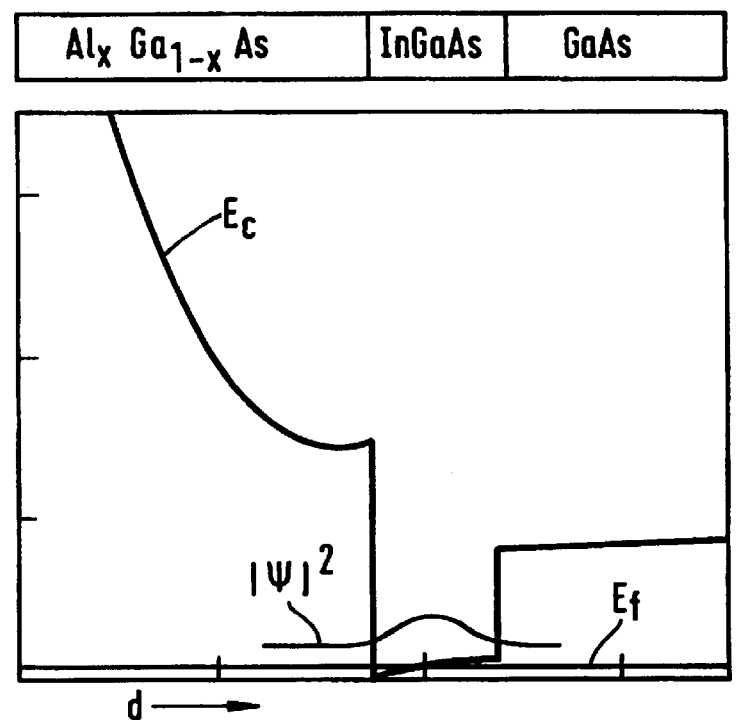
FIGS. 2 and 3 show diagrams in which the lower boundary of the conduction band $E_c$ (conduction band energy), the Fermi energy $E_f$ and the location probability $|\Psi|^2$ are plotted over the distance from the upper side of the semiconductor material for an SH-PHEMT at various gate voltages.
Figure 3:
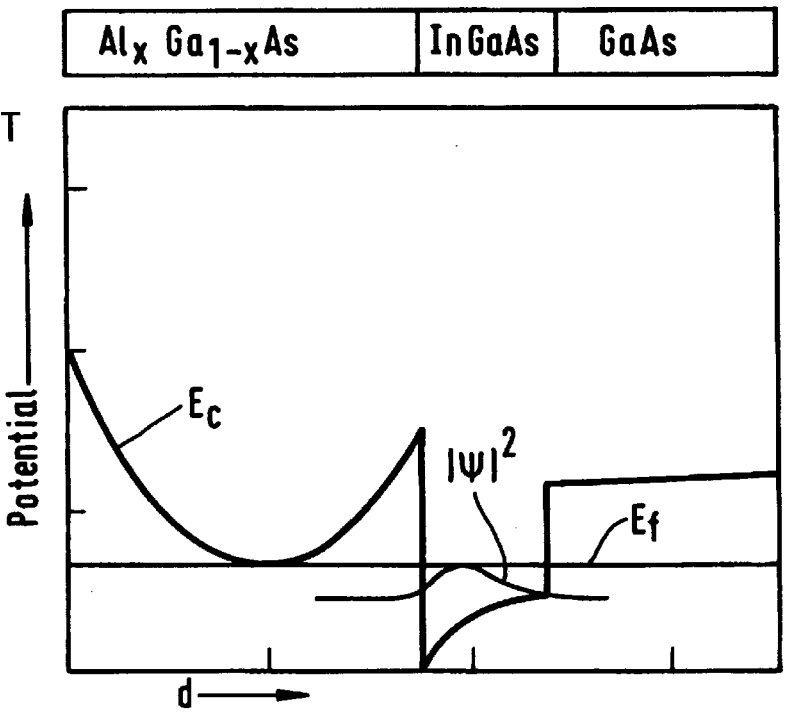
Figure 4:
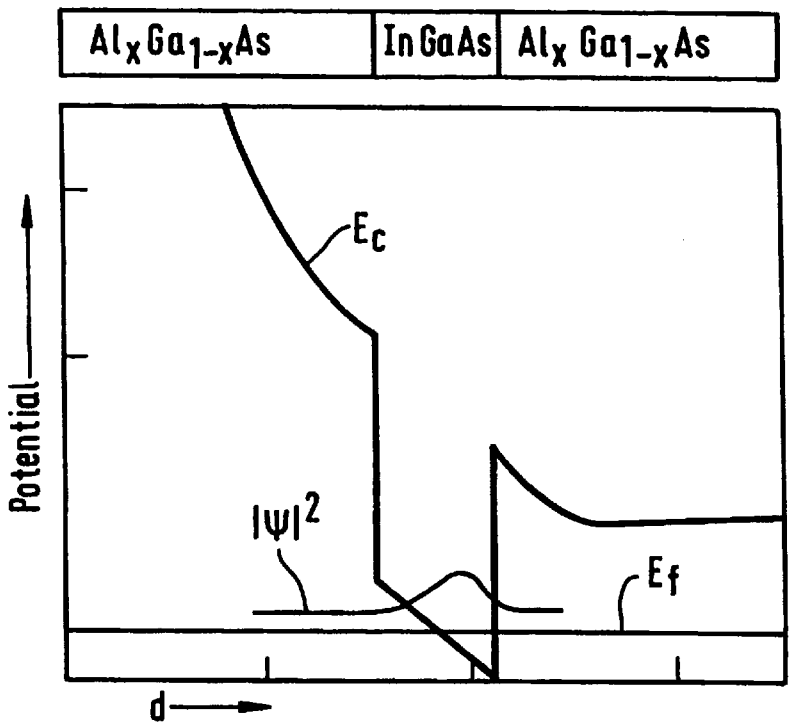
FIGS. 4 and 5 show corresponding diagrams for a DH-PHEMT at various gate voltages.
Figure 5:
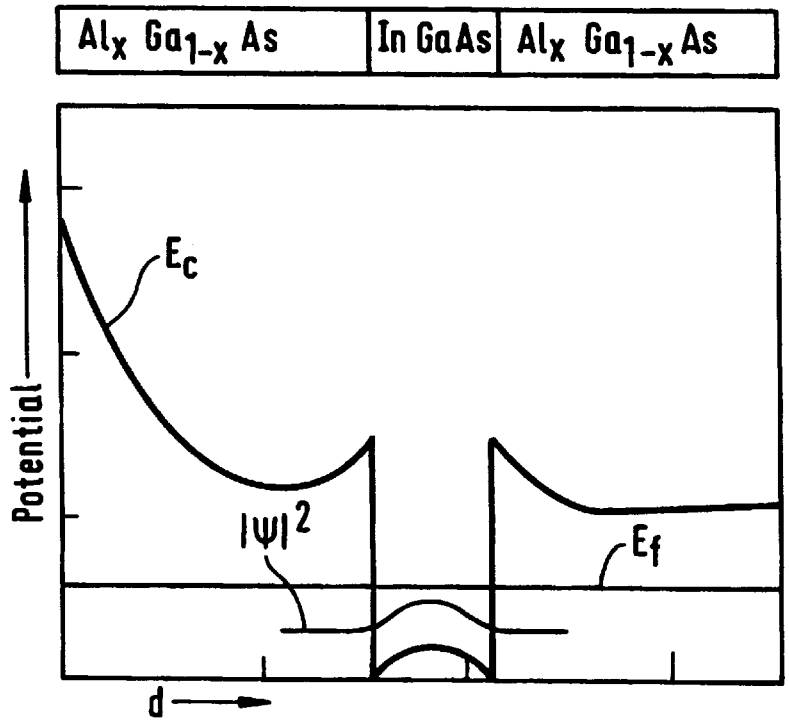

In FIG. 1, a buffer layer 2, a channel region 3, a lower boundary layer 4, an upper boundary layer 5, a source region 6, a drain region 7, a lower separating layer 8, an upper separating layer 9, a gate contact layer 10, a gate contact 11 and source and drain contacts 12 are shown on a substrate 1. The boundary layers 4, 5 are respectively doped n-conductively for the conductivity type provided for the channel region 3. The channel region 3 itself is not doped. The source region 6 and the drain region 7 are both doped highly n-conductive. The gate contact layer 10, which can also be omitted, is not doped or is doped with low n-conductivity, so that a good Schottky contact is brought about between the metal of the gate contact and the semiconductor material. Alternatively, the gate contact layer 10 can also be doped p-conductive, so that a p-n junction creates the contact between the metal of the gate contact and the semiconductor material. The separating layers 8, 9 separate the differently doped regions from one another, and are sufficiently thin above and below the channel region 3 that charge carriers from the doped layers can flow into the channel region. These separating layers 8, 9 can also be omitted.

In a preferred embodiment, the composition of the channel region 3 is $In_yGa_{1-y}As$, and the composition of the boundary layers 4, 5 is $Al_xGa_{1-x}As$. X does not thereby have to be equal for the two boundary layers. For the boundary layers, InGaP or AlInGaP are also possible. The In content in the channel region is selected greater in the upper part than in the lower part. As an example, in a 12 nm-thick InGaAs channel, $In_{0.3}Ga_{0.7}As$ can for example be used in the upper 6 nm-thick portion of the channel, and $In_{0.2}Ga_{0.8}As$ can be used in the lower 6 nm-thick portion of the channel, or for example $In_{0.35}Ga_{0.65}As$ can be used in the upper 6 nm-thick portion of the channel and $In_{0.15}Ga_{0.85}As$ can be used in the lower 6 nm-thick portion of the channel. The In portion y is thus 0.25 on average, as could also be selected for a conventional DH-PHEMT.

Figure 6:
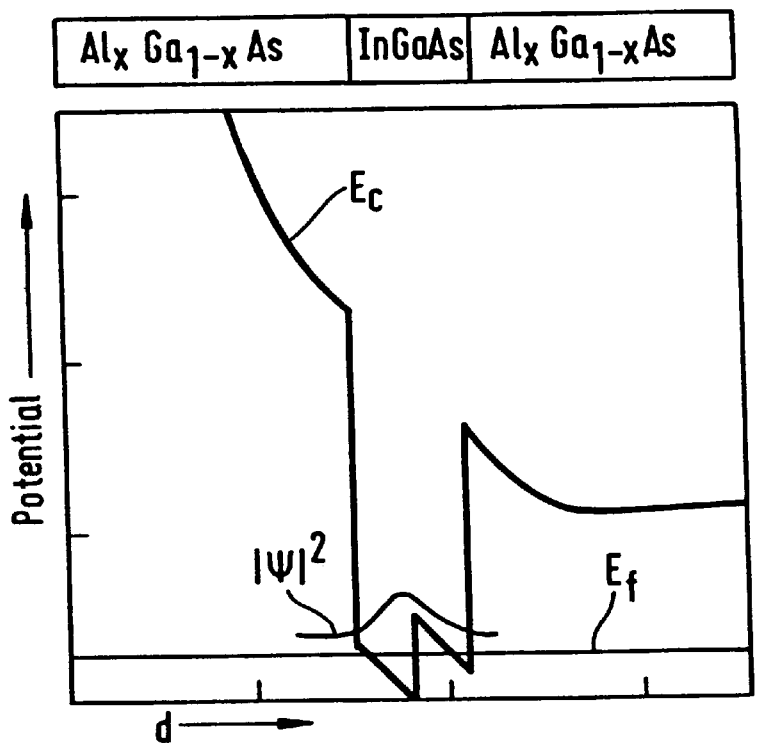
FIGS. 6 and 7 show corresponding diagrams for an inventive HEMT at various gate voltages.
Figure 7:
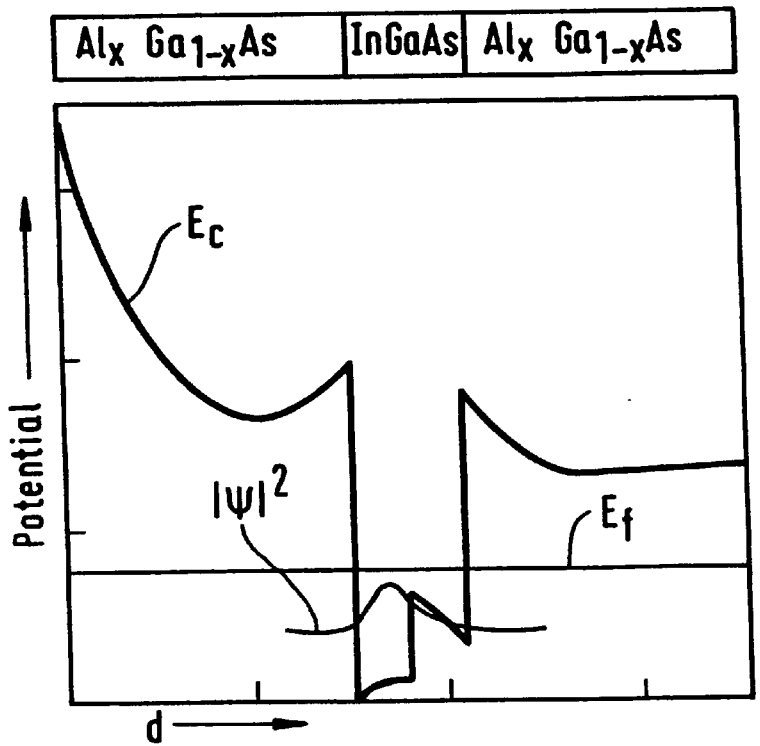

In this way, a path for the lower boundary of the conduction band $E_c$ is obtained as is shown in FIGS. 6 and 7. The discontinuity in the path of the conduction band edge is exactly as large at the lower boundary of the channel region as in the conventional DH-PHEMT, so that its good enclosing of the charge carrier in the channel is maintained under the influence of high fields. At gate voltages close to the cutoff voltage (conditions for low-noise operation), the charge carriers are however not located close to the lower boundary of the channel, but rather more in the center of the channel, comparable to the conventional SH-PHEMT (see FIG. 6). Given more positive gate voltages, the maximum of the charge carrier distribution wanders closer to the upper boundary of the channel (see FIG. 7), which leads to a maximum steepness, which is likewise comparable to the conventional SH-PHEMT. Since, however, the concentration of the charge carriers in the channel and, at the same time, the discontinuity in the conduction band at the upper boundary of the channel region is significantly higher than in the conventional SH-PHEMT, conduction effects in the boundary layer 5 from AlGaAs between the gate contact 11 and the channel region 3 begin only very late, later even than in the conventional DH-PHEMT.

Due to the biasing, explained above, of the InGaAs channel layer, caused by the lattice constant that deviates from the surrounding AlGaAs, the In portion in the channel cannot be arbitrarily increased. A possible further embodiment of the inventive HEMT provides for example an average In portion in the channel of 0.29. In a 10 nm-thick InGaAs channel, for example the upper 6 nm-thick portion of the channel is $In_{0.35}Ga_{0.65}As$, and the lower 4 nm-thick portion of the channel is $In_{0.2}Ga_{0.8}As$.

Instead of the indicated division of the channel into two regions with homogenous composition, several stages with the same composition can be provided. As an example, in a 12 nm-thick InGaAs channel (with boundary layers for example of AlGaAs), for example in the upper 4 nm-thick portion of the channel $In_{0.3}Ga_{0.7}As$ can be present, in the middle 4 nm-thick portion of the channel $In_{0.25}Ga_{0.75}As$ can be present, and in the lower 4 nm-thick portion of the channel $In_{0.2}Ga_{0.8}As$ can be present (average In portion 0.25). As a further example, in a 10 nm-thick InGaAs channel (with boundary layers e.g. of AlGaAs), in the upper 3 nm-thick portion of the channel $In_{0.4}Ga_{0.6}As$ can be present, in the middle 3 nm-thick portion of the channel $In_{0.3}Ga_{0.7}As$ can be present, and in the lower 4 nm-thick portion of the channel $In_{0.2}Ga_{0.8}As$ can be present (average In portion 0.29). A gradual variation of the composition can also be present. The graduation of the mixed crystal composition can extend over the entire thickness of the channel region, or can be present only in a layer-type portion. Since the layer that forms the channel region of the pseudomorphic HEMT has to be very thin, and comprises if warranted only a few atom layers, a graduation of this sort is practically a multilayer modification. With the use of InGaAs for the channel region, it is advantageous if the atomic portions of In at the mixed crystal compositions of the channel region vary by at least 30% with respect to the lowest value.

It is essential for the inventive HEMT that the lower boundary of the conduction band is decreased upward, i.e. toward the gate contact 11, in relation to a channel with a homogenous composition. As in the specified exemplary embodiment, this decreasing can take place in jumps at a level in the interior of the channel region (discontinuity of the $E_c$ curve in the center of the channel in FIGS. 6 and 7). Given a graduated mixed crystal composition, the $E_c$ curve is correspondingly progressively decreased to the left (decreasing distance d from the upper side of the semiconductor crystal).

In this way, the PH-PHEMT with the stepped channel combines the advantages of the conventional SH-PHEMT, namely high peak steepness and good noise behavior, with the advantages of the conventional DH-PHEMTs, namely high charge carrier density, good charge carrier enclosure even given high fields, and large gate voltage range without parasitic transport phenomena in the layer between the gate and the channel. At the same time, it is thus suited for low-noise small-signal circuits, linear circuits and power circuits, up to highest frequencies of about 100 GHz.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A high electron mobility transistor, comprising:

a source region, a channel region, a drain region, and a respective contact in electrically conductive connection with said source region or, respectively, said drain region, and a gate contact;

for construction of a pseudomorphic double heterostructure, an upper boundary layer that is arranged between said channel region and said gate contact, and a lower boundary region that is arranged on a side of said channel region facing away from said gate contact;

said channel region and said upper and lower boundary layers being different semiconductor materials, so that a minimum of a lower boundary of a conduction band in each of said upper and lower boundary layers is greater than a maximum of the lower boundary of the conduction band in the channel region;

said upper and lower boundary layers being doped n-conductive;

the channel region having a mixed crystal composition that varies, continuously or in at least one step, in a direction from said lower boundary layer to said upper boundary layer, such that in the channel region at each distance from the lower boundary layer the lower boundary of the conduction band is not higher than if the mixed crystal composition in the region of this relevant distance from the lower boundary layer up to an arbitrary smaller distance from the lower boundary layer in the channel region were homogenous and equal to the mixed crystal composition in said smaller distance from the lower boundary layer; and in at least one distance from the lower boundary layer, the lower boundary of the conduction band being lower than if the mixed crystal composition in the region from the relevant distance from the lower boundary layer up to the boundary, facing the lower boundary layer, of the channel region were equal to the mixed crystal composition of the channel region at said boundary.

2. The high election mobility transistor according to claim 1, wherein there is a predetermined distance from the lower boundary layer below which the channel region comprises a homogenous mixed crystal composition, and wherein there is a predetermined distance from the lower boundary layer above which the channel region comprises another homogenous mixed crystal composition.

3. The high electron mobility transistor according to claim 2, wherein the channel region also comprises a homogenous mixed crystal composition between said predetermined distances, which composition is different from the mixed crystal compositions between, respectively, a boundary of the channel region and the nearest thereto of said predetermined distances.

4. The high electron mobility transistor according to claim 2, wherein said predetermined distances are equal.

5. The high electron mobility transistor according to claim 1, wherein the channel region is $In_xGa_{1-x}As$, and the variation of the mixed crystal composition is brought about by varied In and Ga portions.

6. The high electron mobility transistor according to claim 1, wherein the boundary layers are AlGaAs.

7. The high electron mobility transistor according to claim 1, wherein the boundary layers are InGaP.

8. The high electron mobility transistor according to claim 1, wherein the boundary layers are AlInGaP.

9. The high electron mobility transistor according to claim 5, wherein atomic portions of In at the mixed crystal compositions of the channel region vary by at least 30% with respect to a lowest value thereof.

10. The high electron mobility transistor according to claim 6, wherein atomic portions of In at the mixed crystal compositions of the channel region vary by at least 30% which respect to a lowest value thereof.

11. The high electron mobility transistor according to claim 7, wherein atomic portions of In at the mixed crystal compositions of the channel region vary by at least 30% which respect to a lowest value thereof.

12. The high electron mobility transistor according to claim 8, wherein atomic portions of In at the mixed crystal compositions of the channel region vary by at least 30% which respect to a lowest value thereof.

* * * * *